US010461230B2

(12) United States Patent
Lopez

(10) Patent No.: US 10,461,230 B2
(45) Date of Patent: Oct. 29, 2019

(54) LIGHT EMITTING DIODE COMPONENT

(71) Applicant: Koninklijke Philips N.V., Eindhoven (NL)

(72) Inventor: Toni Lopez, San Jose, CA (US)

(73) Assignee: Koninklijke Philips N.V., Eindhoven (NL)

(*) Notice: Subject to any disclaimer, the term of this patent is extended or adjusted under 35 U.S.C. 154(b) by 0 days.

(21) Appl. No.: 15/972,480

(22) Filed: May 7, 2018

(65) Prior Publication Data

US 2018/0254390 A1 Sep. 6, 2018

Related U.S. Application Data

(63) Continuation of application No. 14/786,947, filed as application No. PCT/EP2014/057939 on Apr. 17, 2014, now Pat. No. 9,966,511.

(30) Foreign Application Priority Data

Apr. 25, 2013 (EP) ..................... 13165312

(51) Int. Cl.
*H01L 33/58* (2010.01)
*H01L 33/44* (2010.01)
*H01L 33/50* (2010.01)

(52) U.S. Cl.
CPC ............. *H01L 33/58* (2013.01); *H01L 33/44* (2013.01); *H01L 33/507* (2013.01)

(58) Field of Classification Search
CPC ....... H01L 33/58; H01L 33/507; H01L 33/44; H01L 33/60; H01L 33/0079
See application file for complete search history.

(56) References Cited

U.S. PATENT DOCUMENTS 7,423,297 B2 9/2008 Leatherdale et al.
7,452,737 B2 11/2008 Basin et al.
(Continued)

FOREIGN PATENT DOCUMENTS

WO 2005101909 A1 10/2005
WO 2007141763 A1 12/2007

OTHER PUBLICATIONS

Chiang, Chien-Chih, et al., "Preparation of Cerium-Activated GAG Phosphor Powders, Influence of Co-doping on Crystallinity and Luminescent Properties", Journal of the Electrochemical Society, 154 (110) J326-J329, Aug. 16, 2007.
(Continued)

*Primary Examiner* — Syed I Gheyas

(57) ABSTRACT

The present invention relates to a light emitting diode component, comprising a light emitting semiconductor structure having a top surface, and a micro-optical multi-layer structure arranged to guide light out from said light emitting semiconductor structure, said micro-optical multi-layer structure comprising a plurality of layers, wherein an i+1:th layer is arranged on top an i:th layer in a sequence as seen from said semiconductor structure, wherein a refractive index, $n_i$, of the i:th layer is greater than a refractive index, $n_{i+1}$, of the i+1:th layer, and wherein a thickness of the i+1:th layer is greater than a thickness of the i:th layer. The present invention also relates to a light emitting diode comprising such a light emitting diode component.

22 Claims, 3 Drawing Sheets

(56) References Cited

U.S. PATENT DOCUMENTS

| | | |
|---|---|---|
| 2005/0224829 A1 | 10/2005 | Negley et al. |
| 2008/0224157 A1 | 9/2008 | Slater |
| 2009/0057699 A1 | 3/2009 | Basin et al. |
| 2009/0173958 A1 | 7/2009 | Chakraborty et al. |
| 2010/0148199 A1 | 6/2010 | Kim et al. |
| 2011/0018020 A1 | 1/2011 | Jagt |
| 2012/0074835 A1 | 3/2012 | Piquette et al. |
| 2013/0126921 A1* | 5/2013 | Mohammed ........ H01L 33/0079 257/98 |

OTHER PUBLICATIONS

CN First Office Action dated May 2, 2017, China Patent Application No. 201480036636.X, 16 pages.

EPO as ISA, PCT/EP14/57939, "International Search Report and Written Opinion", dated Jul. 1, 2014, 13 pages.

European Search Report from European Application No. 13165312.3 dated Sep. 27, 2013, 11 pages.

Frank Wilhelm Mont, "Graded-refractive-index structures on GaN-based light-emitting diodes for light-extraction-efficiency enhancement and far-field-emission control", Thesis for Rensselaer Polytechnic Institute, 2011, 124 pages.

Helmut Bechtel, "Lumeramic—A New Phosphor Technology for High Performance Solid State Light Sources," Eight International Conference on Solid State Lighting, Aug. 26, 2008, 10 pages, vol. 7058, 10 pages, Proc. of SPIE.

Joong-Yeon Cho, "Forming the graded-refractive-index antireflection layers on light-emitting diodes to enhance the light extraction," Optics Letters, Aug. 15, 2011, pp. 3203-3205, vol. 36, No. 16, Optical Society of America.

Second Office Action dated Jan. 11, 2018, China Patent Application No. 201480036636.X, 8 pages.

\* cited by examiner

LIGHT EMITTING DIODE COMPONENT

CROSS-REFERENCE TO RELATED APPLICATIONS

This application is a continuation of U.S. patent application Ser. No. 14/786,947 filed Oct. 23, 2015, entitled "A LIGHT EMITTING DIODE COMPONENT", issuing as U.S. Pat. No. 9,966,511 on May 8, 2018, which is a § 371 application of International Application No. PCT/EP2014/057939 filed Apr. 17, 2014, which claims the benefit of European Patent Application No. 13165312.3 filed Apr. 25, 2013. U.S. patent application Ser. No. 14/786,947, International Application No. PCT/EP2014/057939, and European Patent Application No. 13165312.3 are incorporated herein by reference.

FIELD OF THE INVENTION

The present invention relates generally to a light emitting diode component, and in particular to a light emitting diode component comprising a micro-optical multilayer structure used to improve the performance of the light emitting diode component.

BACKGROUND OF THE INVENTION

Semiconductor based light emitting diodes (LEDs) are among the most efficient light sources available today. LEDs provide longer lifetime, higher photon flux efficacy, lower operating voltage, narrow-band light emission, and flexibility in terms of assembly compared to conventional light sources.

GaN based LEDs are for instance successfully employed as high power light sources in solid state lighting applications such as illumination, traffic lighting, indoor/outdoor displays, and backlighting electronic displays.

It is however challenging to efficiently couple light out of the LEDs. An epitaxial layer normally has a high refractive index compared to air, $n_{air}=1$, or glass, $n_{glass}=1.5$. The refractive index of GaN, $n_{GaN}$, is for example in the range 2.3-2.5 at visible wavelengths. The large refractive index mismatch between the epitaxial layer and a surrounding medium causes a large portion of the light generated within the epitaxial layer to be scattered or reflected at the interface between the epitaxial layer and its surrounding medium. Only light travelling at angles within a relatively narrow escape cone associated with the interface can refract into the surrounding medium and escape the epitaxial layer. In other words, the external quantum efficiency of the LED is low resulting in a reduced brightness of the LED.

The situation is even more complex when it comes to white light generation using LEDs. White light is generally not generated by tailoring of the emission energy of the epitaxial layer. Instead, light from a blue epitaxial layer, typically GaN based, is converted to white light with the aid of a yellow phosphor material surrounding the epitaxial layer. The surrounding phosphor material down-converts a substantial portion of the epitaxial layer's blue light, changing its color to yellow. Hence, the LED emits both blue and yellow light, which in combination provide white light. In another approach light from a violet or ultraviolet emitting epitaxial layer has been converted to white light by surrounding the epitaxial layer with multicolor phosphors.

The phosphor material, which is typically deposited on a substrate on which the epitaxial layer is grown, causes additional light losses due to scattering at the interface between the substrate and the phosphor material as well as back scattering of light at for instance an air/phosphor material interface.

In order to improve the performance of the LEDs there is therefore a need for better efficiency in guiding light emitted from the epitaxial layer out from the LED.

SUMMARY OF THE INVENTION

An object of the present invention is to solve or at least to reduce the problems discussed above.

In particular according to a first aspect of the invention a light emitting diode component is provided, said light emitting diode component comprising a light emitting semiconductor structure having a top surface and a micro-optical multilayer structure arranged to guide light out from said light emitting semiconductor structure, said micro-optical multilayer structure comprising a plurality of layers, wherein an i+1:th layer is arranged on top an i:th layer in a sequence as seen from said semiconductor structure, wherein a refractive index, $n_i$, of the i:th layer is greater than a refractive index, $n_{i+1}$, of the i+1:th layer. The value of i is selected from the set of positive integers, thus i can be 1, 2, 3, 4, etc. Hence, the invention exploits local index matching techniques to reduce light trapping within the light emitting diode component providing improved light guidance and light output. Another advantage being that the need for a bulky encapsulation of the light emitting diode component, using for instance a dome lens, is reduced. This, in turn, reduces the volume size of the emitter as well as its related costs.

According to an embodiment of the present invention a thickness of the i+1:th layer is larger than a thickness of the i:th layer. This reduces the total internal reflection which increases the light extraction efficiency and thus improves the light output performance. In an embodiment the thickness of the i+1:th layer is 10% larger than the thickness of the i:th layer. In an embodiment the thickness increase of the i+1:th layer with respect to the i:th layer depends on the relative increase of the refractive index of the i+1:th layer with respect to the i:th layer.

According to an embodiment of the present invention a thickness of the i:th layer, $t_i$, is given by:

$$t_i = \frac{\sqrt{A}}{\tan\left[\sin^{-1}\left(\frac{n_{i+1}}{n_i}\right)\right]}$$

wherein A is the top surface area of the multilayer structure.

The use of sufficiently thick micro-optics layers reduces total internal reflection and boosts light outcoupling.

According to an embodiment of the present invention a first layer, as seen from said semiconductor structure, of said multilayer structure has a refractive index substantially equal to the refractive index of a top region of said semiconductor structure. Thereby, an improved light coupling into the multilayer structure is achieved as the reduced discontinuity in the refractive index between the first layer and the semiconductor structure reduces backward reflections. Light trapping within the light emitting diode component is thereby reduced. In an embodiment the refractive index of the multilayer structure deviates less than 10% from the refractive index of a top region of said semiconductor structure. In another embodiment the refractive index of the multilayer structure deviates less than 5% from the refractive index of a top region of said semiconductor structure. In yet another embodiment the refractive index of the multilayer structure deviates less than 1% from the refractive index of a top region of said semiconductor structure.

According to an embodiment of the present invention the light emitting diode component further comprises a wavelength converting layer. This embodiment provides means to adjust the spectral range of the light generated by the light emitting diode component. In other words direct light, of a first wavelength range which is generated by the semiconductor structure is converted by the wavelength converting layer into light of a second wavelength range. The semiconductor structure and the wavelength converting layer, being a single unit, further simplifies the assembly of light emitting diodes in arrays or other configurations for providing efficient illumination sources.

By wavelength converting layer is meant a layer comprising material capable of converting light of a first wavelength range into light of a second wavelength range.

The wording direct light should be construed as light generated directly by the semiconductor structure without any secondary optical processes.

According to an embodiment the wavelength converting layer comprises a phosphor material, a quantum dot, and/or a fluorescent dye. A phosphor material is, in context of the present invention, defined as a material or substance exhibiting light emission after excitation in luminescence, fluorescence or phosphorescence processes.

According to another embodiment the phosphor material comprises a polycrystalline plate, preferable comprising Ce (III) doped gadolinium aluminium garnet (Y, GdAG:Ce). An advantage being that the polycrystalline ceramic plate of YAG:Ce has highly controllable optical and geometrical properties which allows for improved performance of the light emitting diode component. The ceramic plate has a material structure such that scattering within the material is low which allows for improved manufacturing of the light emitting diode component and further allows for a high package efficiency.

According to an embodiment of the present invention the multilayer structure is arranged on top of said wavelength converting layer. It is thereby possible to provide efficient means to couple light out from the wavelength converting layer.

According to an embodiment of the present invention the multilayer structure is arranged below said wavelength converting layer. It is thereby possible to reduce the amount of light from said wavelength converting layer being reflected towards said light emitting semiconductor structure.

According to another embodiment of the present invention the light emitting diode component further comprises an additional micro-optical multilayer structure, wherein said wavelength converting layer is arranged in-between said micro-optical multilayer structure and said additional micro-optical multilayer structure. It is thereby possible to provide efficient means to couple light out from the wavelength converting layer and to reduce the amount of light from said wavelength converting layer being reflected back towards said light emitting semiconductor structure.

According to another embodiment the light emitting diode component further comprises a substrate, preferable a sapphire substrate. An advantage being that the substrate on top of which the light emitting semiconductor structure is fabricated does not have to be removed. This simplifies manufacturing of the light emitting diode component which allows for cost efficient production. A sapphire substrate is a low loss transparent material upon which it is for instance suitable to epitaxially grow GaN based semiconductor structures.

According to an embodiment of the present invention the light emitting diode component further comprises a side layer arranged adjacent to a side surface of said semiconductor structure. The side layer provides better design flexibility when designing the light output of the light emitting diode component.

According to another embodiment the side layer comprises a wavelength converting material, preferably a phosphor material, a quantum dot, and/or a fluorescent dye. This allows for enhanced side emission and thereby better light uniformity of the light emitting diode component which may be of advantage in illumination applications such as backlighting.

According to another embodiment of the present invention the side layer comprises a light reflecting coating material, preferably comprising high reflectance metals or high diffuse reflectance fluoropolymers. An improved light guidance of the light emitting diode component can hereby be obtained.

According to a second aspect of the present invention a light emitting diode (LED) is provided, said LED comprising the above mentioned light emitting diode component arranged on a sub-mount.

According to a third aspect of the present invention a multilayer structure is provided wherein said multilayer structure is arranged to guide light out from a light emitting semiconductor structure having a top surface, said multilayer structure comprising a plurality of layers wherein an i+1:th layer is arranged on top an i:th layer in a sequence as seen from said semiconductor structure, wherein a refractive index, $n_i$, of the i:th layer is greater than a refractive index, $n_{i+1}$, of the i+1:th layer.

It is noted that the invention relates to all possible combinations of features recited in the claims.

BRIEF DESCRIPTION OF THE DRAWINGS

These and other aspects of the present invention will now be described in more detail, with reference to the appended drawings showing embodiments of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1A:
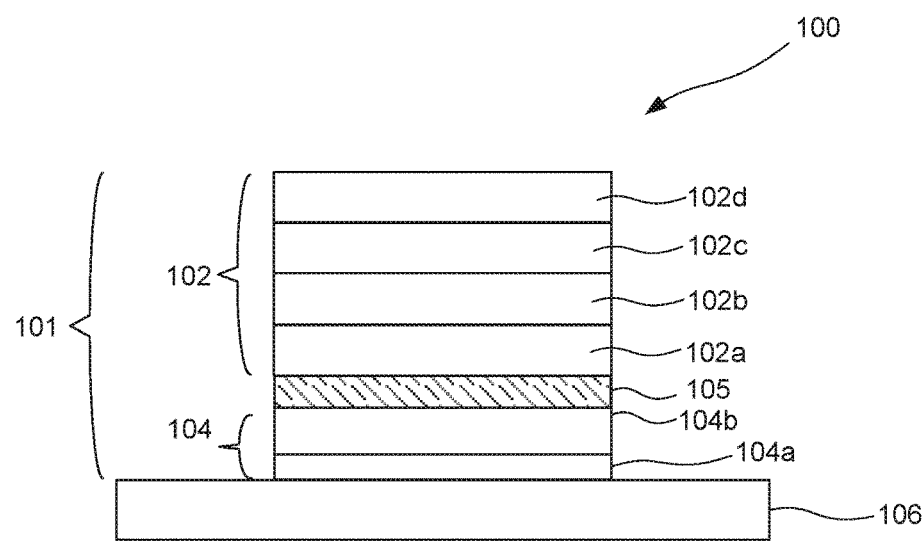
FIG. 1a is a schematic cross sectional view of an embodiment of a LED according to the present invention.

FIG. 1a shows a schematic cross sectional view of a LED 100 according to the present invention. The LED comprises a light emitting diode component 101 wherein a semiconductor structure 104 is arranged to emit light and a micro-optical multilayer structure 102 is arranged to guide light out from the semiconductor structure 104. The light emitting diode component is further attached to a sub-mount 106. The micro-optical multilayer structure 102 comprises a plurality of layers 102a -102d. The i+1:th layer of said plurality of layers 102a -102d is arranged on top the i:th layer in the sequence as seen from said semiconductor structure 104. The value of i is selected from the set of positive integers, thus i can be 1, 2, 3, 4, etc. For example, in this embodiment the $2^{nd}$ layer is provided on the $1^{st}$ layer, the $3^{rd}$ layer is provided on the $2^{nd}$ layer and the $4^{th}$ layer is provided on the $3^{rd}$ layer. A refractive index, $n_i$, of the i:th layer is further greater than a refractive index, $n_{i+1}$, of the i+1:th layer. Furthermore, a thickness of the i+1:th layer is larger than a thickness of the i:th layer. This reduces the total internal reflection which increases the light extraction efficiency and thus improves the light output performance. In embodiments the increase of the thickness of the i+1:th layer with respect to the thickness of the i:th layer depends on the relative increase of the refractive index of the i+1:th layer with respect to the i:th layer. For example a larger increase of the refractive index of the i+1:th layer with respect to the i:th layer results in a larger increase of the thickness of the i+1:th layer with respect to the thickness of the i:th layer. In a practical example the i+1:th layer has a refractive index of 1.65 the i:th layer has a refractive index of 1.55 and then the thickness of the i+1:th layer is about 440 μm and the thickness of the i:th layer is about 360 μm. An increased thickness, optimized according to the refractive indices, may change the angular field emission which may become broader which is beneficial in many applications requiring side emission.

In a further embodiment, a thickness of the i:th layer, $t_i$, is given by:

$$t_i = \frac{\sqrt{A}}{\tan\left[\sin^{-1}\left(\frac{n_{i+1}}{n_i}\right)\right]}$$

wherein A is the top surface area of the micro-optical multilayer structure 102. The surface area of the multilayer structure 102 is substantially equal to the surface area of the top surface of the light emitting semiconductor structure 104.

In FIG. 1a the semiconductor structure 104 is shown in a flip-chip (FC) configuration. The semiconductor structure 104 comprises an epitaxial layer 104a and a substrate 104b. The epitaxial layer 104a further comprises a pn-junction, having at least one n-type GaN layer, one GaN based active region, and one p-type GaN layer. Light is generated in the active region after biasing the n- and p-type layers. The generated light is extracted from the sides of the GaN layers, typically the n-type layer, and substrate 104b. The substrate 104b is therefore of sapphire which is a low loss transparent material. In addition, sapphire has a lattice constant similar to that of GaN enabling good growth quality of the GaN epitaxial layer 104a of GaN.

The semiconductor structure 104 is attached to the sub-mount 106. The n-type and p-type regions of the epitaxial layer 104a can be electrically contacted via metal layers (not shown) to metal contacts (not shown) in the sub-mount 106. The attachment of the semiconductor structure 104 to the sub-mount may e.g. be made by means of stud-bumps. But also other attachment methods known by the skilled person could be suitable to use.

The sub-mount 106 is highly reflecting in order to reflect light generated by the semiconductor structure and emitted in a direction towards the sub-mount 106. This improves the light emission through the top surface of the semiconductor structure 104. The sub-mount may e.g. be a highly reflective printed circuit board (PCB) having for instance a SMD like geometry.

It should be noted that other configurations of the semiconductor structure is possible as will be described below.

The light emitting diode component 101 further comprises a wavelength converting layer 105. The use of a wavelength converting layer 105 provides means to adjust the spectral range of the light generated by the light emitting diode component 101.

According to this embodiment the light emitting diode component 101 is arranged to emit white light. Light in the blue spectral range is produced by a GaN based epitaxial layer 104a emitting direct blue light and the wavelength converting layer 105 comprises a phosphor, here a polycrystalline plate comprising Ce (III) doped gadolinium aluminium garnet (Y, GdAG:Ce) generating light in the yellow spectral region. Hence, the light emitting diode component 101 emits both blue and yellow light, which in combination provide white light. An advantage of this set-up is that the polycrystalline ceramic plate of YAG:Ce has highly controllable optical and geometrical properties which allows for improved performance of the light emitting diode 101. The ceramic plate has for instance a refractive index of about 1.8 in the visible range of the wavelength spectrum which closely matches that of sapphire. Thereby a reduction of the scattering at the interface between the substrate 104b and the wavelength converting layer 105 can be obtained. The wavelength converting layer 105 has further a material structure such that scattering within the material is low which allows for improved light emitting efficiency.

The micro-optical multilayer structure 102 comprises transparent layers 102a-102d arranged as described above. By subsequently grading the refractive index of the layers, as seen from the semiconductor structure 104, a large portion of the light generated within the semiconductor structure 104 can be emitted from the light emitting diode component 101. In other words, the light scattering is reduced at the interfaces of the layers and an overall increase in the light output from the light emitting diode 101 is accomplished. By additionally applying a corresponding grading of the thickness of the layers, the light emitting efficiency of the light emitting diode 101 is further improved.

The micro-optical multilayer structure 102 is arranged on top of said wavelength converting layer 105 being a top portion of the semiconductor structure 104. An improved light coupling into the micro-optical multilayer structure 102 may be achieved by tailoring the refractive index of the first layer 102a, as seen from the semiconductor structure 104, of the micro-optical multilayer structure 102 and the top portion of the semiconductor structure 104 resulting in reduced light scattering at the interface of the two. Light trapping within the semiconductor structure 104 is thereby reduced.

In order to reduce the light scattering at the interface of the first layer 102a, as seen from the semiconductor structure 104, of the micro-optical multilayer structure 102 and the top portion of the semiconductor structure 104, the first layer 102a of the micro-optical multilayer structure 102 has a refractive index substantially equal to the refractive index of a top region of the semiconductor structure 104. In an embodiment the refractive index of the first layer 102a of the micro-optical multilayer structure 102 deviates less than 10% from the refractive index of a top region of said semiconductor structure 104. In another embodiment the refractive index of the first layer 102a of the micro-optical multilayer structure 102 deviates less than 5% from the refractive index of a top region of said semiconductor structure 104. In yet another embodiment the refractive index of the first layer 102a of the micro-optical multilayer structure 102 deviates less than 1% from the refractive index of a top region of said semiconductor structure 104. In yet another embodiment the refractive index of the first layer 102a of the micro-optical multilayer structure 102 is equal to the refractive index of a top region of said semiconductor structure 104.

Figure 1B:
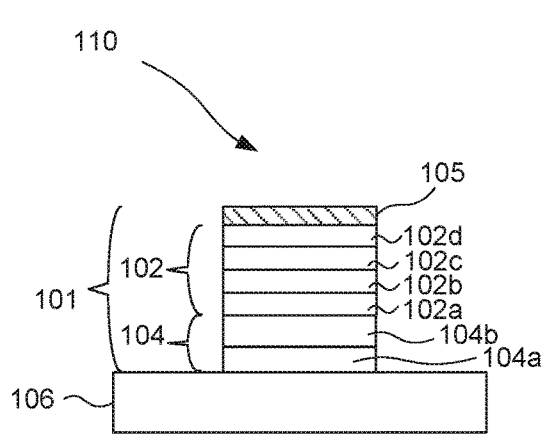
FIG. 1b is a schematic cross sectional view of an alternative embodiment of a LED according to the present invention.

FIG. 1b shows a schematic cross sectional view of a LED 110 according to an alternative embodiment of the present invention. The LED comprises a light emitting diode component 101, wherein a semiconductor structure 104 is arranged to emit light, a micro-optical multilayer structure 102, as described in relation to FIG. 1a, is arranged to guide light out from the semiconductor structure 104. A wavelength converting layer 105 is further arranged on top of the micro-optical multilayer structure 102. An advantage of this embodiment is that the micro-optical multilayer structure 102 can reduce the amount of light emitted from the wavelength converting layer being reflected back towards the light emitting semiconductor structure. Hence an improved LED performance is obtained.

Figure 1C:
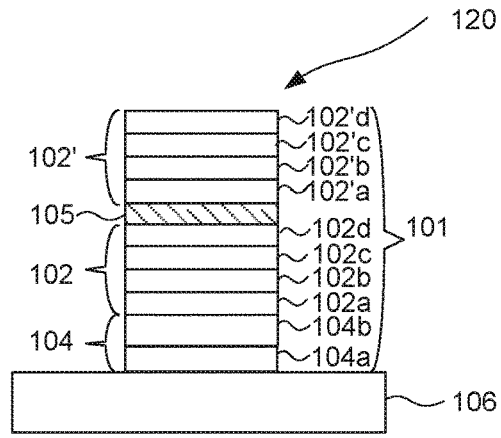
FIG. 1c is a schematic cross sectional view of yet an alternative embodiment of a LED according to the present invention.

FIG. 1c shows a schematic cross sectional view of a LED 120 according to another embodiment of the present invention. The light emitting diode component comprises the same components as described in relation to FIG. 1a and FIG. 1b and in addition an additional micro-optical multilayer structure 102'. The micro-optical multilayer structure 102 and the additional micro-optical multilayer structure 102' are arranged on opposing sides of the wavelength converting layer 105. It is thereby possible to provide efficient means to couple light out from the wavelength converting layer and to reduce the amount of light from said wavelength converting layer being reflected back towards said light emitting semiconductor structure.

It should be noted that according to this embodiment the refractive indices of the first layers 102a, 102'a of the micro-optical multilayer structure 102 and the additional the micro-optical multilayer structure 102' are equal to or slightly lower than the refractive index of the semiconductor structure 104 and that of the wavelength converting layer 105, respectively. According to the description above the refractive indices of the layers 102b, 102'b are lower than that of the first layers 102a, 102'a.

Moreover, according to an embodiment of the present invention the refractive index of the final layer 102d of the micro-optical multilayer structure 102 being arranged below the wavelength converting layer 105 as seen from the top of the light emitting diode component 101 is lower than the refractive index of the wavelength converting layer 105, which can have a refractive index similar to that of the epitaxial layer 104a or the substrate 104b.

It should also be noted that the micro-optical multilayer structure 102 and the additional micro-optical multilayer structure 102' may be identical, hence comprising the similar layers structures and having substantially the same physical properties.

The micro-optical multilayer structure 102 may comprise standard glass of for instance SF 11 type. Alternatively, the multilayer structure 102 may comprise epoxy or silicon materials. Highly transparent materials of this kind are readily available with refractive indices between at least 1.48 and 2. Index matching glues to form the multilayer stack are also needed and generally available in the market (see e.g. U.S. Pat. No. 7,423,297B2). Alternatively, silicone based layers may be bonded by means of an over moulding process like proposed in U.S. Pat. No. 7,452,737B2.

According to one embodiment a top layer of the micro-optical multilayer structure has a refractive index higher than or equal to the refractive index of a medium being on top of the micro-optical multilayer structure. The tailoring of the refractive index difference between the top layer of the micro-optical multilayer structure and the surrounding medium, which may for instance be air or silicone, provides improved light guidance and light output.

Figure 1D:
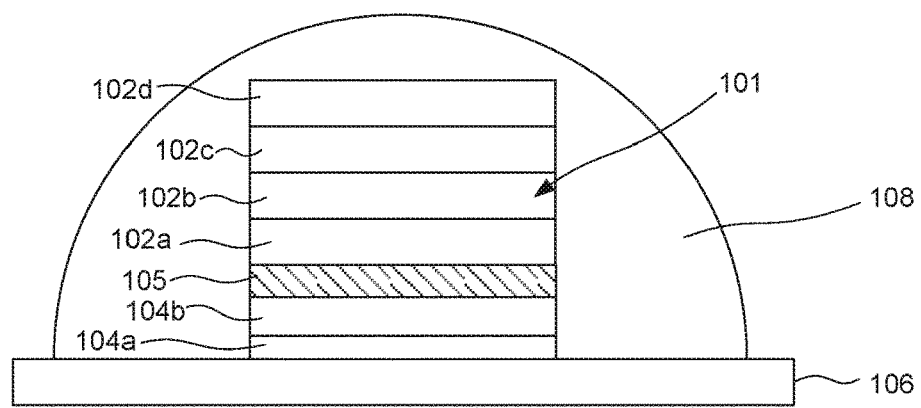
FIG. 1d is a schematic cross sectional view of a further alternative embodiment of a LED according to the present invention.

According to another embodiment of the present invention the light emitting diode component 101 is enclosed in a dome shaped lens structure 108, as shown in FIG. 1d. The lens structure is arranged to increase the light output and direct the light from the semiconductor structure. The dome shaped lens structure 108 may for instance be made of silicone.

A top layer 102d of the micro-optical multilayer structure 102 has a refractive index higher than or equal to the refractive index of a medium being on top of the top layer 102d. The tailoring of the refractive index difference between the top layer 102d of the multilayer structure 102 and the surrounding medium, i.e. air or the lens structure 108 provides improved light guidance and light output.

Light generated by the epitaxial layer is, in state of the art FC configurations such as in Patterned Sapphire Substrate (PSS) based light emitting diodes, coupled out via a sapphire substrate into either the air or via the dome encapsulation material and then into the air. Hence a large portion of the generated light is trapped by total internal reflection in the light emitting diode component. The sapphire substrate is moreover typically 100 to 800 micrometers in thickness which leads to a large portion of the light being emitted in a direction towards the sides of the substrate. This light is to a large extent reflected at the interface of the substrate and its surrounding medium due to the large refractive index mismatch at the interface. To ensure that at least a part of this back reflected light can exit the light emitting diode component, the highly reflective sub-mounts are commonly used in FC based light emitting diode components.

According to an embodiment of the present invention it is an objective to mitigate this problem.

Figure 2:
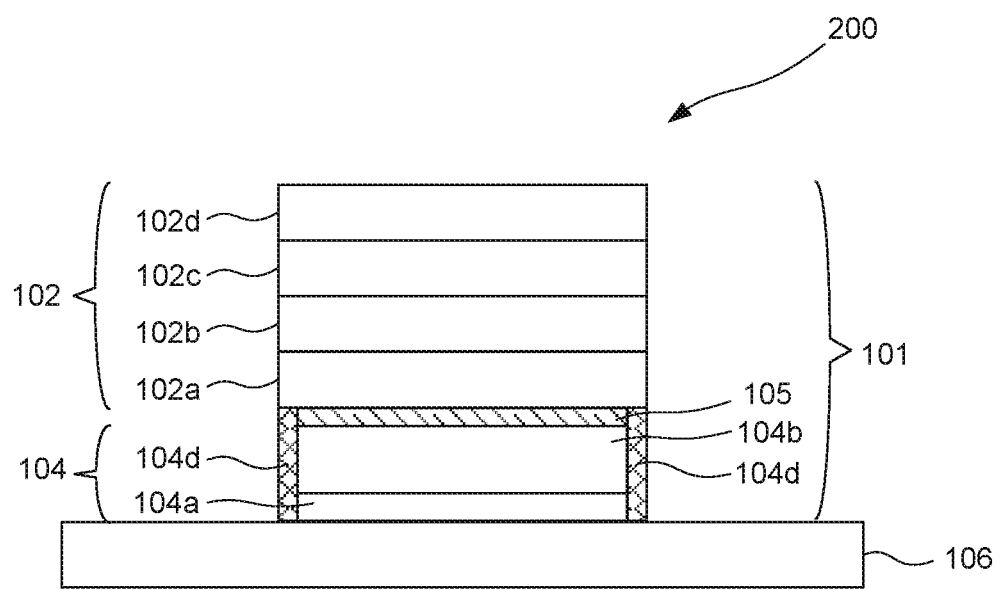
FIG. 2 is a schematic cross sectional view of yet an alternative embodiment of a LED according to the present invention.

Accordingly, FIG. 2 shows a schematic cross sectional view of a LED 200 according to the present invention. The LED 200 comprises a light emitting diode component 101 comprising a semiconductor structure 104 and a micro-optical multilayer structure 102 as disclosed in relation to FIG. 1a to FIG. 1d. The light emitting diode component 101 further comprises a side layer 104d arranged adjacent to a side surface of said semiconductor structure 104. The side layer 104d covers one or more of the sides of the semiconductor structure 104. The side layer provides better design flexibility when designing the light output of the light emitting diode component 101. The side layer 104d comprises wavelength converting material, preferably a phosphor material. The side layer 104d and the wavelength converting layer 105 may form a common layer. The side layer 104d and the wavelength converting layer 105 may be arranged to provide light emission having the same colour point.

It should be noted that the side layers 104d extend from the epitaxial layer 104a of the semiconductor structure 104 at least to the wavelength converting layer 105. Hence a large portion of the light being emitted in a direction towards the sides of the substrate can thereby enter the side layer 104d, where the spectral range of at least a portion of the light can be changed by the wavelength converting material of the side layer 104d. An overall improved light emission is thereby obtained. Moreover, the light emitted by the light emitting diode component 101 may have an increased angular distribution which can be of advantage for example in backlighting applications where the perceived light spottiness of the light emitting diodes are to be reduced.

Alternatively, the side layer 104d may comprise a light reflecting material arranged to reflect light emitted from the semiconductor structure 104, i.e. from the epitaxial layer 104a and the wavelength converting layer 105 so that a larger portion of the emitted light is coupled out of the top layer 102d of the light emitting diode component 101.

According to another embodiment of the present invention the substrate is at least partly removed. The removal of at least a part of the substrate may e.g. be done by laser assisted lift-off, grinding, chemical- mechanical polishing, or wet etching or any other suitable processing technique. The removal of at least a part of the substrate maybe made such that the semiconductor structure is at least partly exposed. The resulting device structure is usually referred to as a light emitting diode having a thin-film-flip-chip (TFFC) geometry. With the TFFC geometry absorption losses in the transparent substrate can be avoided providing improved brightness of the light emitting diode component. A further increase in the light output of the light emitting diode may be achieved by roughening or patterning of the exposed surface of the semiconductor structure whereby the fraction of light coupled out from the semiconductor structure improved. As a result the external quantum efficiency of the light emitting diode component may be improved. A further advantage is that other substrates may be used during epitaxial growth, including silicon or SiC.

Figure 3A:
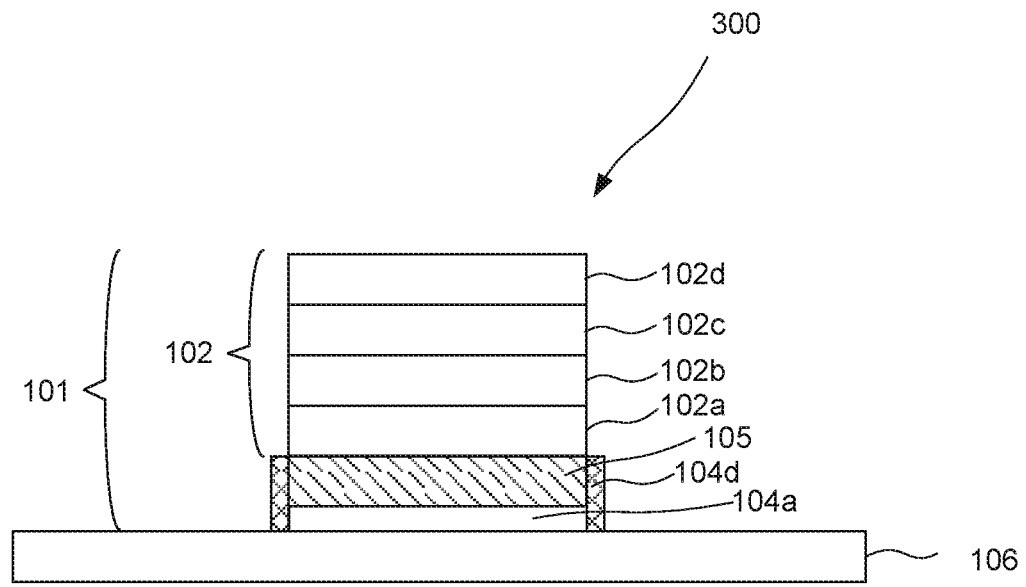
FIG. 3a is a schematic cross sectional view of a further embodiment of a LED according to the present invention.

FIG. 3a discloses a light emitting diode (LED) 300, comprising a light emitting diode component 101 having a TFFC geometry. The light emitting diode component 101 comprises a semiconductor structure 104 comprising an epitaxial layer 104a and a wavelength converting layer 105, as described above. The epitaxial layer 104a is mounted on a sub-mount 106 and the wavelength converting layer 105 is deposited on the epitaxial layer 104a. A micro-optical multilayer structure 102 comprising a plurality of layers 102a-102d is arranged on top of the wavelength converting layer 105.

The light emitting diode component 101 further comprises a side layer 104d arranged adjacent to a side surface of said semiconductor structure 104. The side layer 104d covers one or more of the sides of the semiconductor structure 104. The side layer 104d comprises light reflecting material arranged to reflect light emitted from the semiconductor structure 104, i.e. from the epitaxial layer 104a and the wavelength converting layer 105 so that a larger portion of the emitted light is coupled out of the top layer 102d of the light emitting diode component 101.

Additionally, the side layer 104d may comprise wavelength converting material, preferably a phosphor material. The function and benefits of using converting material are described above.

Figure 3B:
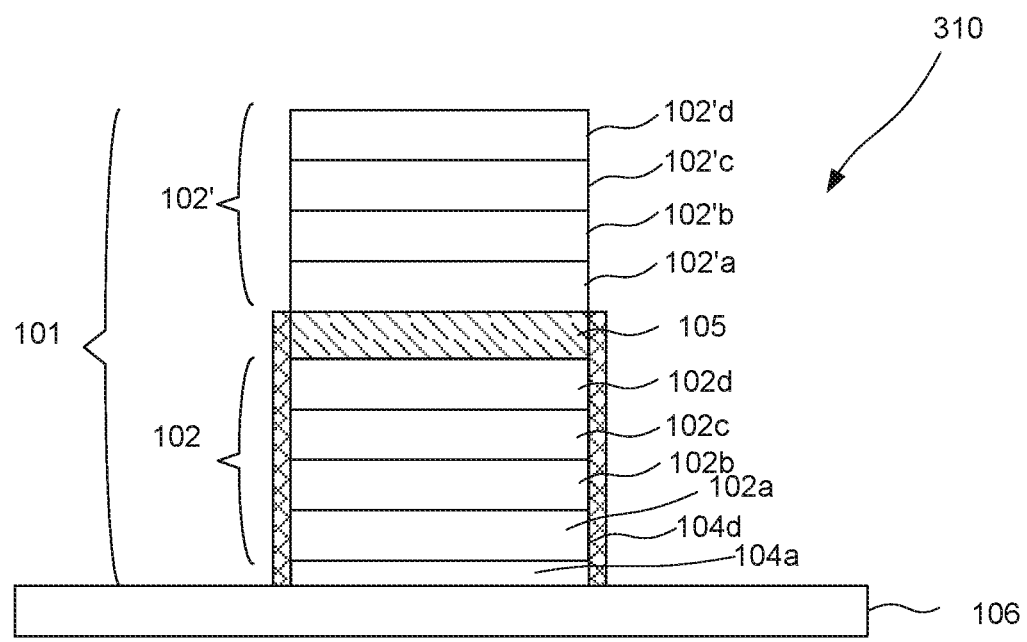
FIG. 3b is an alternative embodiment of a LED according to the present invention.

FIG. 3b discloses an alternative embodiment of a LED 310, comprising a light emitting diode component 310 having a TFFC geometry. The light emitting diode component 101 comprises a semiconductor structure 104 comprising an epitaxial layer 104a, a side layer 104d and a wavelength converting layer 105, as described above. The light emitting diode further comprises a micro-optical multilayer structure 102 and an additional micro-optical multilayer structure 102' arranged on opposing sides of the wavelength converting layer 105.

The advantages of the present embodiment are the same as the ones described in relation to FIG. 1c. The side layers 104d extend from the epitaxial layer 104a at least to the wavelength converting layer 105 to prevent direct light emitted from the epitaxial layer 104a to exit the sides of the micro-optical multilayer structure 102.

In case the side layer 104d comprises a reflecting material this leads to a large portion of the light being emitted in a direction towards the sides of the multilayer structure 102 can be reflected towards the wavelength converting member 105.

In case the side layer 104d comprises a wavelength converting member the large portion of the light being emitted in a direction towards the sides of the multilayer structure can enter the side layer 104d, where the spectral range of at least a portion of the light can be changed by the wavelength converting material of the side layer 104d. Hence an overall improved light emission is obtained. Moreover, may the light emitted by the light emitting diode component 101 have an increased angular distribution which can be of advantage for example in backlighting applications where the perceived light spottiness of the light emitting diodes are to be reduced.

Computer simulations reveal that using a micro-optical multilayer structure according to the present invention result in improved light output from light emitting diode components. The light output from two different light emitting diode components were compared with a state of the art PSS chip scale package (CPS) LED. The PSS-CPS LED comprise a semiconductor structure having a substrate layer with a refractive index of 1.8, and top and side layers each having a refractive index of 1.5.

By increasing the refractive index of the wavelength converting layer to be substantially the same (about 1.8) to that of the substrate layer, by for instance using a high refractive index material such as a wavelength converting layer comprising Ce (III) doped gadolinium aluminium garnet (Y, GdAG:Ce), the relative gain in the light output was simulated to be 3.4%. If additionally a multilayer layer structure is formed by arranging a transparent layer having a refractive index of 1.7 on top of the high refractive index material a relative gain in the light output of about 7.6% can be achieved. Moreover, a relative gain in light output of 12.1% can be achieved if a multilayer structure comprising a first layer and a second layer on top of the high refractive index material is used. The first and the second layer were set to have a refractive index of 1.7 and 1.48, respectively.

For simplicity, each the layers were assumed to have a thickness of 400 micrometer. Further light emitting efficiency improvements may be obtained by a grading of the thickness of subsequent layers corresponding to the grading of the refractive index of the subsequent layers. Thus, an increase of the refractive index between subsequent layers corresponds to an increase of the thickness between subsequent layers. Analogously, a decrease of the refractive index between subsequent layers corresponds to a decrease of the thickness between subsequent layers.

The simulations also show that encapsulated light emitting diodes can have an increased light output when comprising a multilayer structure. In the simulations a 3 mm lens structure having a refractive index of 1.5 (e.g. silicone) was used. The first and the second layer were set to have a refractive index of 1.75 and 1.6, respectively. The gains achieved for the different configurations disclosed above were for the encapsulated light emitting diodes 7.0%, 8.3%, and 8.5%, respectively.

Hence it should be noted that according to the simulations a light emitting diode component comprising a multilayer structure but being without encapsulation may outperform a reference PSS-CSP LED structure with a lens structure. This insight may be advantageous when fabricating highly efficient light emitting diodes and further allow for increased packing efficiency of the light emitting diodes.

The person skilled in the art realizes that the present invention by no means is limited to the preferred embodiments described above. On the contrary, many modifications and variations are possible within the scope of the appended claims.

For example the wavelength converting layer 105 may comprise a quantum dot (QD). QDs are small crystals of semiconducting material generally having a width or diameter of only a few tens of nanometers. They have the advantage that when excited by incident light, they emit light where the wavelength of the light is determined by the size and material of the QD. Further, they show very narrow emission bands and thus provide saturated colors, where the light output of a particular color can be produced by tailoring the material and size of the QDs used. QDs with emission in the far-red upon red excitation could for instance be achieved by using QDs comprising a material selected from the group consisting of but not limited to II-VI and III-V QDs, preferably InP, CdTe, CdTe/CdSe core-shell structures, ternary mixtures such as $CdSe_xTe_y$, or chalcopyrite QDs such as $Cu_xIn_ySe_2$ or $Cu_xIn_yS_2$. The QDs can be overcoated with higher band-gap materials such as CdS and ZnS for enhanced emissive properties.

The wavelength converting layer 105 could comprise an inorganic phosphor, wherein said inorganic phosphor comprises a material doped with $Cr^{3+}$, preferably a material selected from the group consisting of $Y_3Al_5O_{12}:Cr^{3+}$.

The wavelength converting layer 105 could comprise a fluorescent dye.

The wavelength converting layer 105 may comprise Lumiramic™.

For example the active region of the epitaxial layer 104a can further include heterostructure layers comprising e.g. $In_xAl_yG_{1-x-y}N$ to tailor the band gap and thereby the emission wavelengths of the light emitting diode component. Quantum well (QW) or multi-quantum well (MQW) structures, obtained using for instance quantum confining layers of $GaIn/In_xG_{1-x}N$ could further be located in the active region to locally increase the concentration of holes and electrons, which due to the increased recombination rate leads to an increased number of photons emitted from the light emitting diode component.

The GaN layers may have a total thickness of about 5 micrometer. This thickness is not critical and could vary as long as high concentrations of defects that presumably hinder the LED performance can be avoided. The sapphire substrate is typically 200 micrometers thick but in other embodiments the thickness could range from 10-800 micrometers.

The light emitting diode component may further comprise bonding layers arranged to connect the plurality of layers in the multilayer structure. It is preferred that the bonding layers have refractive indexes matching the surrounding layers in order to reduce light scattering at the interfaces.

The bonding layer may comprise silicone.

The lens structure may have various geometrical shapes such as spherical, or elliptical. The top of the lens structure may further be textured, randomly, into a Fresnel lens shape, or with a photonic crystal structure.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A method, comprising:
providing a light emitting semiconductor structure grown on a growth substrate;
removing at least a portion of the growth substrate; and
forming a multilayer structure arranged to guide light out from a surface of the light emitting semiconductor structure, the multilayer structure covering the surface of the light emitting structure, the multilayer structure comprising a plurality of layers, wherein an i+1:th layer is arranged on top an i:th layer in a sequence as seen from the light emitting semiconductor structure, wherein a refractive index, $n_i$, of the i:th layer is greater than a refractive index, $n_{i+1}$, of the i+1:th layer, wherein the value of i is selected from the set of positive integers, wherein a thickness of the i+1:th layer is greater than a thickness of the i:th layer.

2. The method of claim 1, wherein the thicknesses of the i+1:th layer and the i:th layer are on the order of hundreds of microns.

3. The method of claim 1, wherein a thickness of the i:th layer, $t_i$, is given by:

$$t\_i=\sqrt{A}/\tan[\sin\char94(-1)(n\_(i+1)/n\_i)]$$

wherein A is the top surface area of the multilayer structure.

4. The method of claim 1, further comprising attaching the light emitting semiconductor structure to a mount.

5. The method of claim 1, wherein removing at least a portion of the growth substrate comprises removing the entire growth substrate.

6. The method of claim 5, further comprising roughening or patterning a surface of the light emitting semiconductor structure exposed by removing the entire growth substrate.

7. The method of claim 5, wherein forming a multilayer structure comprises forming the multilayer structure on a surface of the light emitting semiconductor structure exposed by removing the entire growth substrate.

8. The method of claim 5, further comprising disposing a wavelength converting material on a surface of the light emitting semiconductor structure exposed by removing the entire growth substrate.

9. The method of claim 1, wherein removing at least a portion of the growth substrate comprises a technique selected from the group consisting of laser-assisted lift off, grinding, chemical-mechanical polishing, and wet etching.

10. The method of claim 1, further comprising forming a wavelength converting material over the light emitting semiconductor structure.

11. The method of claim 1, further comprising forming a reflective material on a side surface of the light emitting semiconductor structure.

12. The method of claim 1, further comprising forming a lens over the light emitting semiconductor structure.

13. The method of claim 3, wherein the thicknesses of the i+1:th layer and the i:th layer are on the order of hundreds of microns, and the top surface area is in the order of hundred thousand of square micron.

14. A device, comprising:
a light emitting semiconductor structure attached to a mount; and
a multilayer structure disposed over a surface of the light emitting semiconductor structure from which at least a portion of a growth substrate has been removed, the multilayer structure covering the surface of the light emitting structure, the multilayer structure comprising a plurality of layers, wherein an i+1:th layer is arranged on top an i:th layer in a sequence as seen from the semiconductor structure, wherein a refractive index, $n_i$, of the i:th layer is greater than a refractive index, $n_{i+1}$, of the i+1:th layer, wherein the value of i is selected from the set of positive integers, wherein a thickness of the i+1:th layer is greater than a thickness of the i:th layer.

15. The device of claim 14, wherein the multilayer structure is disposed in direct contact with the surface of the light emitting semiconductor structure from which at least a portion of a growth substrate has been removed.

16. The device of claim 14, further comprising a wavelength converting material disposed between the multilayer structure and the surface of the light emitting semiconductor structure from which at least a portion of a growth substrate has been removed.

17. The device of claim 16, further comprising an additional multilayer structure, wherein the wavelength converting layer is arranged in-between the multilayer structure and the additional multilayer structure.

18. The device of claim 14, further comprising a lens disposed over the multilayer structure.

19. The device of claim 14, wherein a first layer, as seen from the light emitting semiconductor structure, of the multilayer structure has a refractive index equal to the refractive index of a top region of the light emitting semiconductor structure.

20. The device of claim 14, further comprising a side layer arranged adjacent to a side surface of the semiconductor structure.

21. The device of claim 20, wherein the side layer is selected from the group consisting of a wavelength converting material, a phosphor material, a quantum dot, a fluorescent dye, a light reflecting coating material, high reflectance metals, and high diffuse reflectance fluoropolymers.

22. The device of claim 14, wherein the thicknesses of the i+1:th layer and the i:th layer are on the order of hundreds of microns, and the multilayer structure has a top surface area is in the order of hundred thousand of square micron.

* * * * *